(12) United States Patent
Ishigami (10) Patent No.: US 7,651,941 B2
(45) Date of Patent: Jan. 26, 2010

(54) METHOD OF MANUFACTURING A SEMICONDUCTOR DEVICE THAT INCLUDES FORMING A VIA HOLE THROUGH A REACTION LAYER FORMED BETWEEN A CONDUCTIVE BARRIER AND A WIRING

(75) Inventor: Takashi Ishigami, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 171 days.

(21) Appl. No.: 11/892,925

(22) Filed: Aug. 28, 2007

(65) Prior Publication Data
US 2008/0057698 A1    Mar. 6, 2008

(30) Foreign Application Priority Data
Aug. 30, 2006    (JP)    ............... 2006-233819

(51) Int. Cl.
*H01L 21/4763*    (2006.01)
(52) U.S. Cl. .................. 438/637; 438/643; 438/656; 257/E21.579
(58) Field of Classification Search .......... 438/648
See application file for complete search history.

(56) References Cited

U.S. PATENT DOCUMENTS

| 5,904,565 | A  | * | 5/1999 | Nguyen et al. | ............... | 438/687 |
| 2001/0030366 | A1 | * | 10/2001 | Nakano et al. | ............... | 257/758 |
| 2005/0130407 | A1 | * | 6/2005 | Tu | ............................ | 438/631 |
| 2006/0118962 | A1 | * | 6/2006 | Huang et al. | ................. | 257/760 |

FOREIGN PATENT DOCUMENTS

JP    2006-60166    3/2006

* cited by examiner

*Primary Examiner*—Stephen W Smoot
(74) *Attorney, Agent, or Firm*—McGinn IP Law Group, PLLC (57) ABSTRACT

Provided are: a method of manufacturing semiconductor device which has multilayer interconnection in a damascene structure and a conductive barrier film such as CoWP film, and which has more excellent electric characteristics than a conventional one. To this end, when a via hole reaching a lower wiring is formed, a reaction layer formed between a conductive barrier film and the lower wiring and remaining on the surface of the lower wiring is removed. Thus, at an interface where a lower surface of the via and the lower wiring are joined, the reaction layer, formed between the conductive barrier film and the lower wiring, does not exist, so that the via resistance can be sufficiently reduced.

16 Claims, 10 Drawing Sheets

METHOD OF MANUFACTURING A SEMICONDUCTOR DEVICE THAT INCLUDES FORMING A VIA HOLE THROUGH A REACTION LAYER FORMED BETWEEN A CONDUCTIVE BARRIER AND A WIRING

BACKGROUND OF THE INVENTION

1. Field of the Invention

The present invention relates to a semiconductor device and a method of manufacturing the same, and particularly to a semiconductor device having multilayer interconnection, and a conductive barrier film, which are formed in a damascene structure, and a method of manufacturing the semiconductor device.

2. Description of the Related Art

For a semiconductor device having a Cu wiring, as a technology for improving electromigration resistance, there is a well known technology, as disclosed in Japanese Patent Application Laid-open Publication No. 2006-60166, for example, in which a conductive barrier film such as cobalt tungsten phosphorous (CoWP) is formed on a Cu wiring.

A semiconductor device using a conventional conductive barrier film is described below with reference to FIG. 10.

Figure 10:
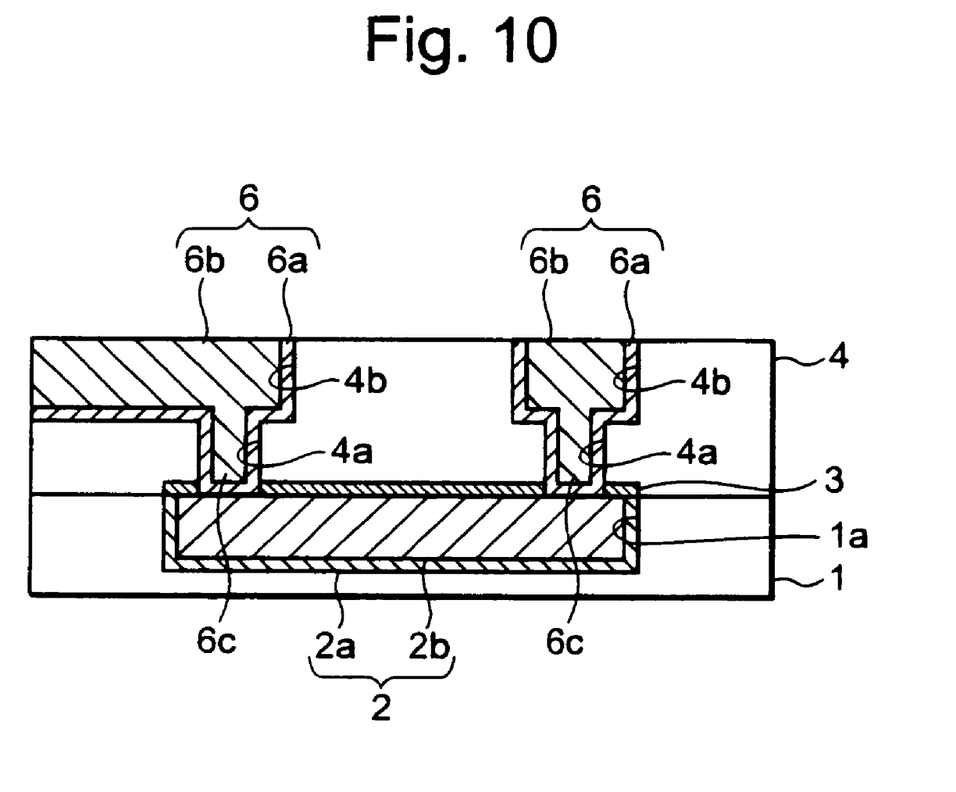
FIG. 10 is a cross-sectional view showing a semiconductor device of the conventional technology.

FIG. 10 is a cross-sectional view showing a structure of a conventional semiconductor device. On an Si substrate (not shown), a first interlayer insulation film 1 having a lower wiring groove 1a is formed. In the lower wiring groove 1a of the first interlayer insulation film 1, a lower wiring 2 is formed in which a first barrier metal film 2a and a first Cu film 2b are formed. On the lower wiring 2, a conductive barrier film 3 such as CoWP is formed.

On the first interlayer insulation film 1 and the conductive barrier film 3, a second interlayer insulation film 4 is formed. In a lower portion of the second interlayer insulation film 4 and in the barrier film 3, a via hole 4a is formed so that an upper surface of the lower wiring 2 is exposed through the via hole 4a, and an upper wiring groove 4b communicated with the via hole 4a is concurrently formed on an upper portion of the second interlayer insulation film 4. In the via hole 4a and the upper wiring groove 4b, an upper wiring 6, constituted by a second barrier metal film 6a and a second Cu film 6b, is formed. The upper wiring 6 is formed in the via hole 4a and has a via 6c, constituted by the second barrier metal film 6a and the second Cu film 6b, through which the lower wiring 2 and the upper wiring 6 are electrically connected to each other.

Here, pay attention to connection parts between the vias 6c and the lower wiring 2 in FIG. 10. These connection parts do not have a conductive barrier film at an interface where a lower surface of the vias 6c and the lower wiring 2 are joined. In other words, when the via hole 4a is formed, a conductive barrier film is removed from the bottom of the via hole 4a.

However, in a conventional technology, the following problem has been occurred.

The inventor has newly found out that a reaction layer is unnecessarily formed between a conductive barrier film such as CoWP and a lower wiring. To be more precise, in the conventional case, even if a conductive barrier film is removed from the bottom of a via hole at the time of forming the via hole while, for example, a CoWP layer or a CoWB layer as a barrier film is used, a reaction layer (Co—Cu alloy) mainly made of Co in a barrier film and Cu constituting the lower wiring remains on the surface of a lower wiring. For this reason, a high resistance reaction layer is serially inserted between a via and a lower wiring, which causes a problem that the resistance of the via cannot be sufficiently reduced.

SUMMARY

An aspect of the present invention is the provision of a method of manufacturing a semiconductor device having a multilayer interconnection formed in a damascene structure. The method includes the steps of: forming a lower wiring on a first interlayer insulation film; selectively forming a conductive barrier film on the lower wiring; forming a second interlayer insulation film covering the first interlayer insulation film and the conductive barrier film; and forming a via hole in at least the second interlayer insulation film and the conductive barrier film, whereby the via hole reaches the lower wiring. The method the step of forming the via hole includes a step of removing a reaction layer formed between the conductive barrier and the lower wiring.

An aspect of the present invention is the provision of a semiconductor device which includes: a lower wiring formed so that a recess of the first interlayer insulation film is filled with the lower wiring; a conductive barrier film selectively formed on the lower wiring; a second interlayer insulation film formed on the first interlayer insulation film and the conductive barrier film; and a via formed at least in the second interlayer insulation film, the via reaching the lower wiring. In this device, the conductive barrier film does not exist at an interface where a lower surface of the via and the lower wiring are joined. Also in this device, a reaction layer, formed between the conductive barrier film and the lower wiring, does not exist.

According to the present invention, when a via hole is formed, the reaction layer is removed. This reaction layer is formed between the conductive barrier film, remaining on the surface of the lower wiring, and the lower wiring. Accordingly, at the interface where the lower surface of the via and the lower wiring are joined, the reaction layer, formed between the conductive barrier film and the lower wiring, does not exist, so that the resistance of the via can be sufficiently reduced.

According to the present invention, at the interface where the lower surface of the via and the lower wiring are joined, the reaction layer, formed between the conductive barrier film and the lower wiring, is removed. As a result, it is possible to provide a semiconductor device and a method of manufacturing the same having more excellent electric characteristics than the conventional technology.

DETAILED DESCRIPTION OF THE PREFERRED EMBODIMENTS

Embodiments of the present invention are described below with reference to the accompanying drawings.

Figure 1:
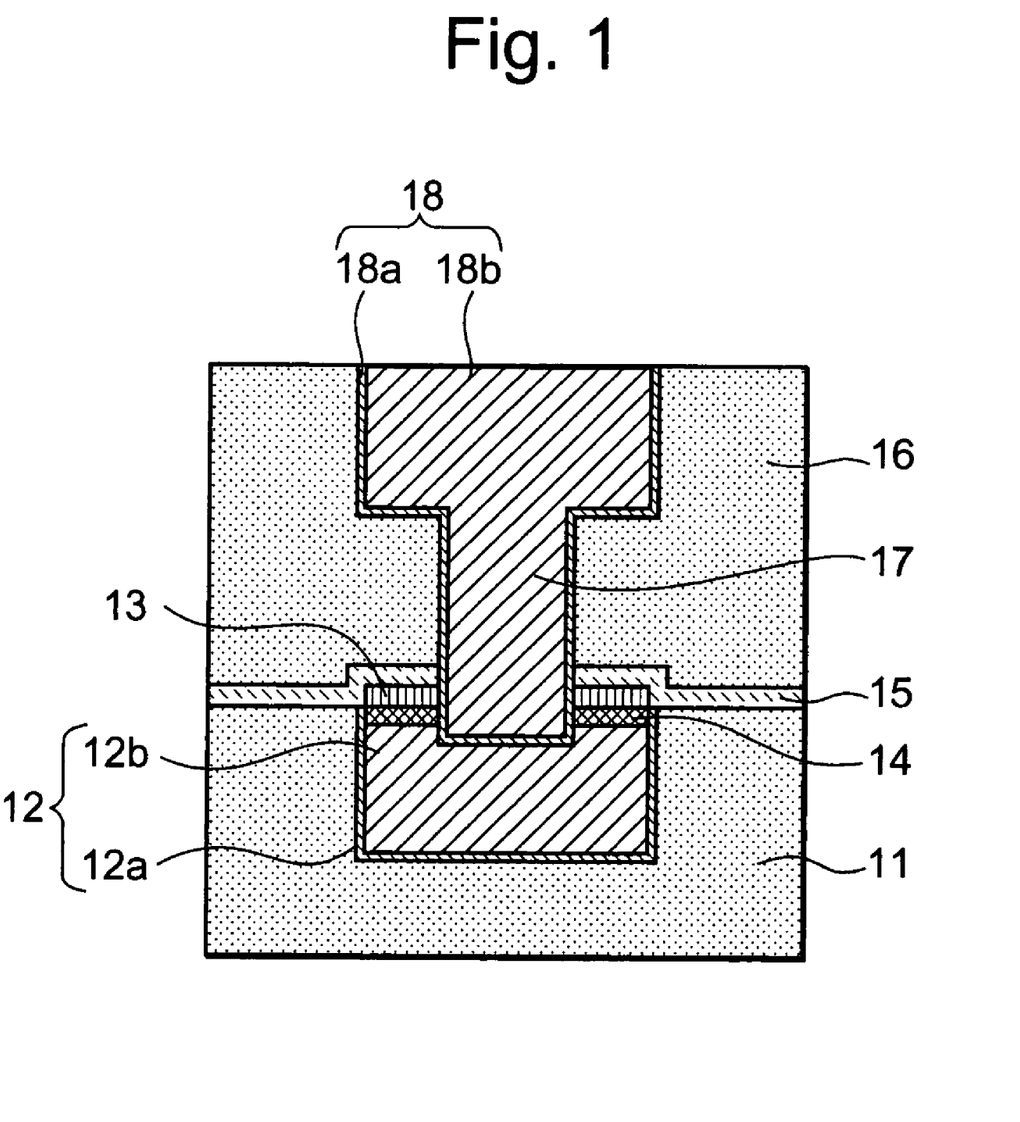
FIG. 1 is a cross-sectional view showing a semiconductor device of a first embodiment of the present invention.

FIG. 1 is a cross-sectional view showing a structure of a semiconductor device of a first embodiment of the present invention.

As shown in FIG. 1, a first interlayer insulation film 11 having a lower wiring 12 is formed on a semiconductor substrate (not shown) where an element, such as a transistor, is formed. A lower wiring includes a first barrier metal film 12a and a first Cu film 12b. On the lower wiring 12, a conductive barrier film 13, such as CoWP, is formed. In addition, between the conductive barrier film 13 and the lower wiring 12, a reaction layer (Co—Cu alloy) 14 is formed mainly made of: Co in CoWP; and Cu constituting a lower wiring. Further, on the first interlayer insulation film containing a CoWP layer, a diffusion barrier film 15, such as SiCN, is formed. As described later, the step of forming the diffusion protection film 15 can be omitted.

On the diffusion protection film 15, a second interlayer insulation film 16 is formed. On the second interlayer insulation film and the conductive barrier film 13, a via 17, connected to the lower layer 12, is formed; concurrently, on an upper portion of the second interlayer insulation film, an upper wiring 18, communicating with the via 17, is formed. The via 17 and the upper wiring 18 are formed of a third barrier metal 18a and a second Cu film 18b.

An aspect of the semiconductor device of the present embodiment is that the reaction layer 14 does not exist at an interface where a lower portion of the via 17 and the lower wiring 12 are joined. This reaction layer 14 is formed between the conductive barrier film 13 such as a CoWP layer, and the lower wiring 12. To be more precise, as shown in FIG. 1, the CoWP layer 13 and the reaction layer 14 are not formed on the lower wiring 12 except for a bottom of the via 17; however, the reaction layer 14 does not exist at the interface where the lower portion of the via 17 and the lower wiring 12 are joined. Further, since the reaction layer 14 has been removed, the lower surface of the via 17 is formed at a position which is lower than an upper surface of the lower wiring 12. Thus, it is possible to effectively prevent the increase in via resistance. This problem has been occurred, in the conventional technology, because the reaction layer 14 having high resistance is serially inserted between the via 17 and the lower wiring 12. As described above, the semiconductor device, which has the via resistance sufficiently lower than that of the conventional technology, can be acquired.

FIGS. 2 to 5 are cross-sectional views of steps showing a method of manufacturing the semiconductor device of the present embodiment of the present invention.

Figure 2A:
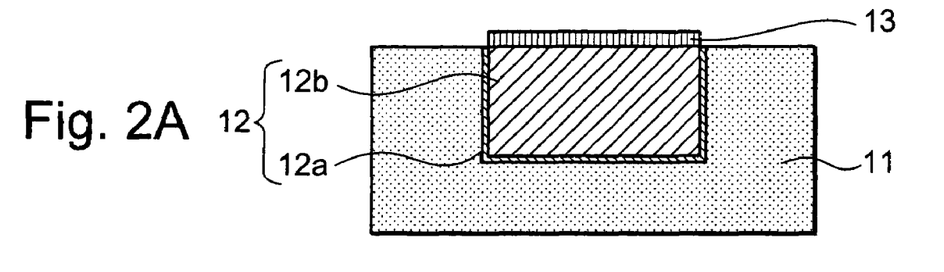
FIGS. 2A to 2C are cross-sectional views of steps for illustrating a method of manufacturing the semiconductor device of the first embodiment thereof.

First, the first interlayer insulation film 11 is formed on a semiconductor substrate (not shown) where an element such as a transistor is formed. Then, a hard mask film (not shown) formed of SiO2, for example, is laminated. Subsequently, by using a known damascene wiring technology, the first barrier film 12a and the lower wiring 12 are formed; the first barrier film 12a is formed from, for example, a Ta/TaN laminated film, and the lower wiring 12 is formed from the first Cu film 12b. Incidentally, the hard mask film has been removed when a CMP is performed.

Next, as shown in FIG. 2A, by using a plating method, the CoWP layer 13 serving as a conductive barrier film is selectively formed on the lower wiring 12.

Figure 2B:
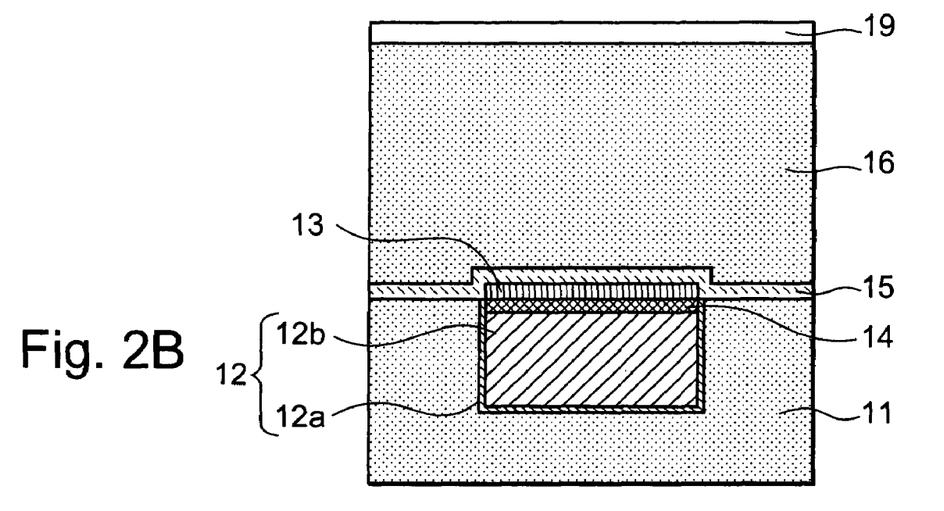

Subsequently, by using, for example, a CVD method, the diffusion barrier film 15, formed from an SiCN film, is formed. Thereafter, as shown in FIG. 2B, the second interlayer insulation film 16 is formed on the diffusion barrier film 15. Subsequently, a hard mask film 19 formed of, for example, SiO2 is formed.

When the second interlayer insulation film 16 is deposited, as shown in FIG. 2B, the reaction layer 14 is formed between the lower wiring 12 and the CoWP layer 13, by using heat applied to the semiconductor substrate. With respect to the reaction layer 14, Co in CoWP, and Cu in the lower wiring mainly react with each other, whereby Co—Cu alloy is formed. Further, for example, when a CoWP layer of 15 nm thick is deposited, the reaction layer 14 is formed as an amorphous layer of about 15 nm thick.

Figure 2C:
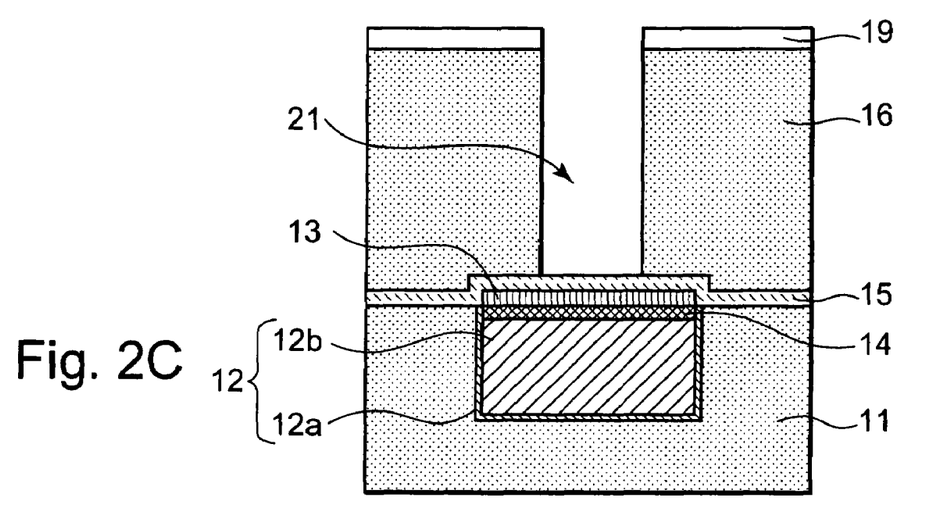

Next, a resist pattern (not shown) is formed by photolithography on the hard mask film 19 to form a via hole 21. Then, by using the resist pattern as a mask, dry etching is performed on the hard mask film 19 and the second interlayer insulation film 16, whereby the via hole 21 is formed (FIG. 2C). This via hole 21 passes through the hard mask film 19 as well as the second interlayer insulation film 16, and reaches the SiCN film 15.

Figure 3A:
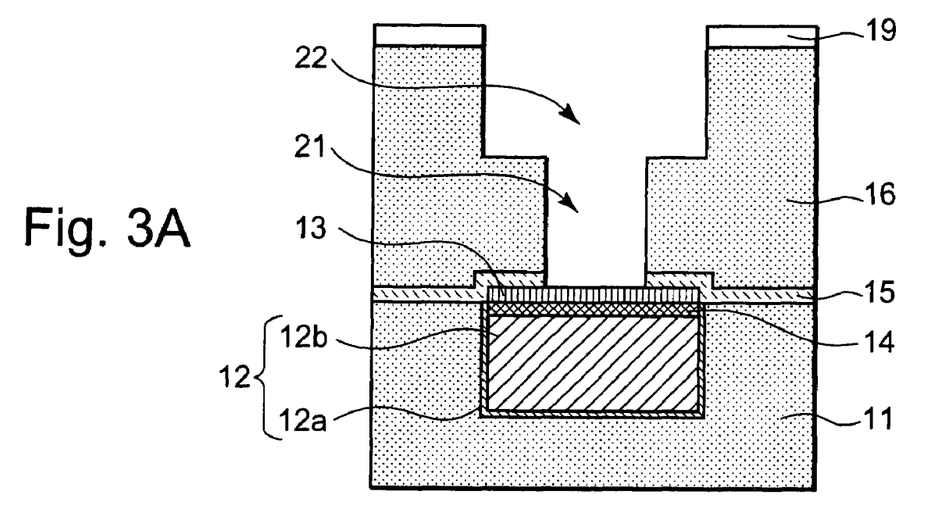
FIGS. 3A and 3B are cross-sectional views of steps for illustrating a method of manufacturing the semiconductor device of the first embodiment thereof.

Next, as shown in FIG. 3A, as in the case of the forming method of the via hole 21, by using photolithographic and dry etching methods, an upper wiring groove 22 is formed in the hard mask film 19 and the second interlayer insulation film 16. Incidentally, when the upper wiring groove 22 is formed, the SiCN film 15 at the bottom of the via hole 21 is removed.

Figure 3B:
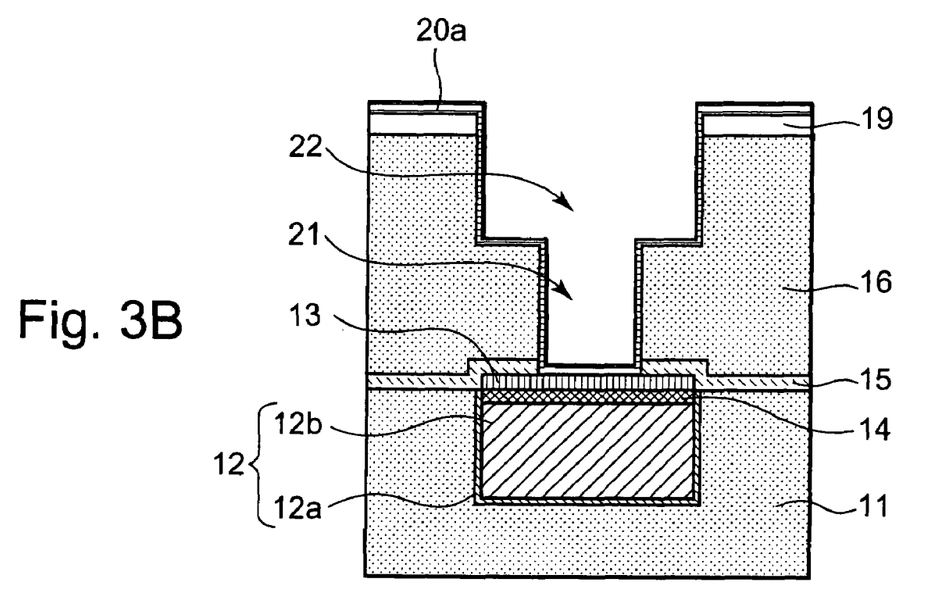

Subsequently, as shown in FIG. 3B, a second barrier metal film 20a, formed from a Ta/TaN laminated film, is deposited, by sputtering.

Figure 4A:
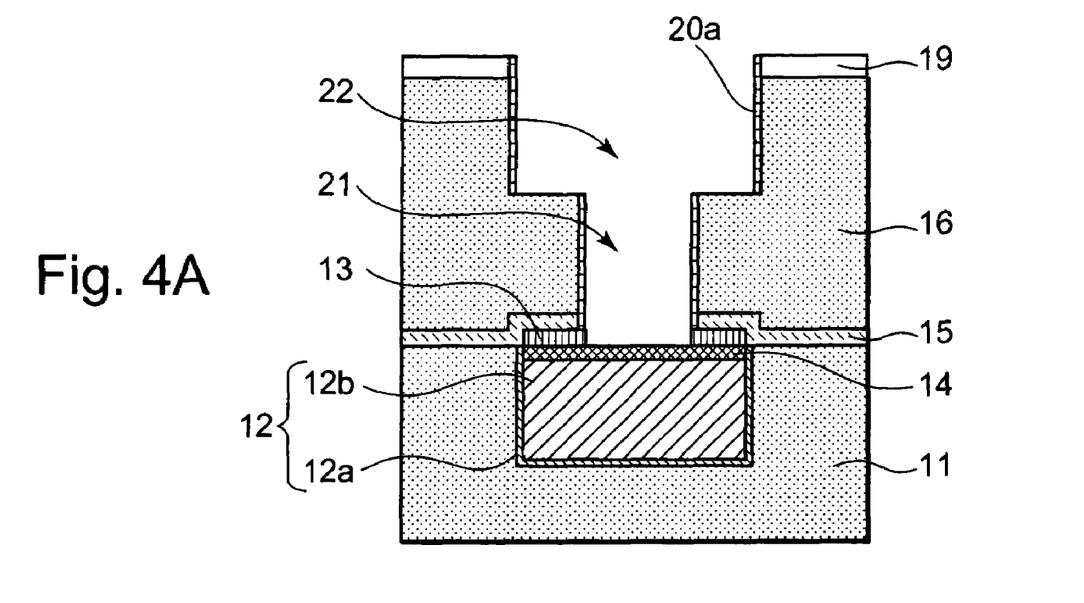
FIGS. 4A and 4B are cross-sectional views of steps for illustrating a method of manufacturing the semiconductor device of the first embodiment thereof.

Next, as shown in FIG. 4A, the barrier metal film 20a at the bottom of the via 21, and the CoWP layer 13 are removed by sputter etching, by using, for example, argon gas (Ar). As an example of a sputter etching condition, assuming that an RF output is 600 W, an amount of flow of Ar gas is 7.0 sccm, and etching time is 15.0 seconds, then the barrier metal film 20a at the bottom of the via hole 21, and the CoWP layer 13 can be removed.

Figure 4B:
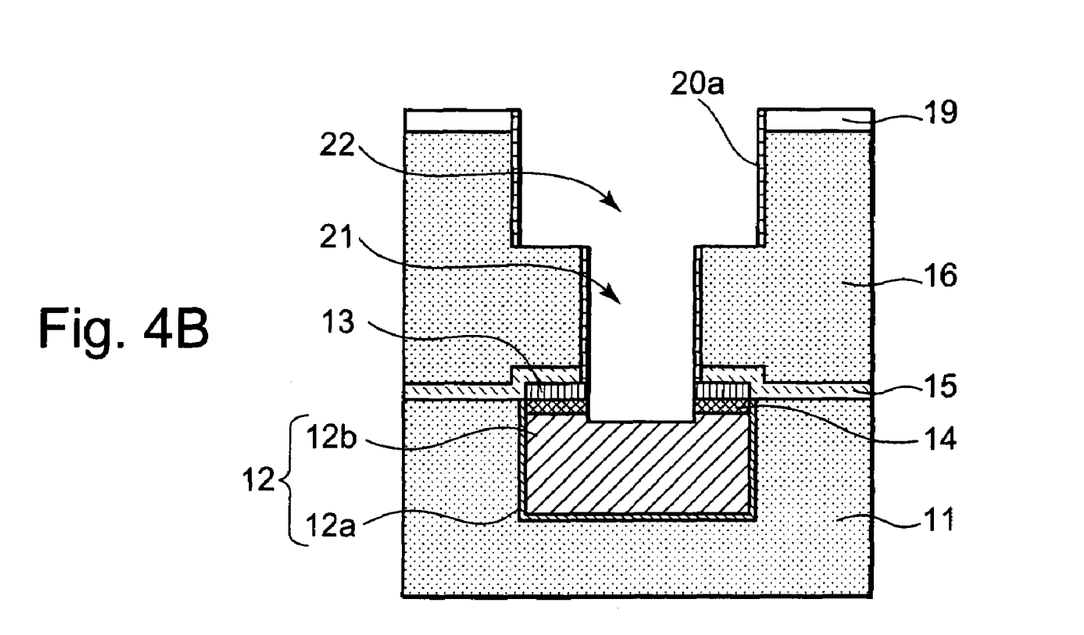

Next, as shown in FIG. 4B, to remove the reaction layer 14, formed of Co—Cu alloy, remaining on the lower wiring 12, the bottom of the via 21 is further etched by sputter etching with Ar gas, for example. Here, a sputter etching condition is controlled, as needed, in response to the thickness of the reaction layer and the like. As described above, when a CoWP layer of 15 nm, for example, is deposited, a reaction layer is formed in the range of approximately 5 to 15 nm. As an example, the reaction layer 14 can be fully removed under the condition that an RF output is 500 W, an amount of flow of Ar gas is 7.0 sccm, and etching time is 6.0 seconds. On the shape of a cross-section of the bottom of the via 21 hole, it can be seen that the reaction layer 14 has been fully removed so that the lower surface of the via hole 21 is formed at a position lower than the upper surface of the lower wiring 12.

Further, when the bottom of a via is etched, Cu or the like of the lower wiring is generally adhered to the via hole, and a side wall of a wiring groove. For this reason, it has been widely known that, deterioration in performance sometimes occurs in relation to insulation resistance and a Time Dependent Dielectric Breakdown (TDDB), between the neighboring wirings. Particularly, in the present embodiment, the CoWP layer 13 and the reaction layer 14 are removed by etching. As a result, the splashing of Co, Cu or the like sometimes occurs. However, as described above, since a side wall of the second interlayer insulation film 16 is covered with the second barrier metal film 20a, substances such as Co and Cu do not adhere to the side wall of the second interlayer insulation film 16. Thus, it is possible to prevent performance deterioration, caused by the above metals entering the second interlayer insulation film 16, in relation to insulation resistance and the TDDB between the neighboring wirings.

Figure 5A:
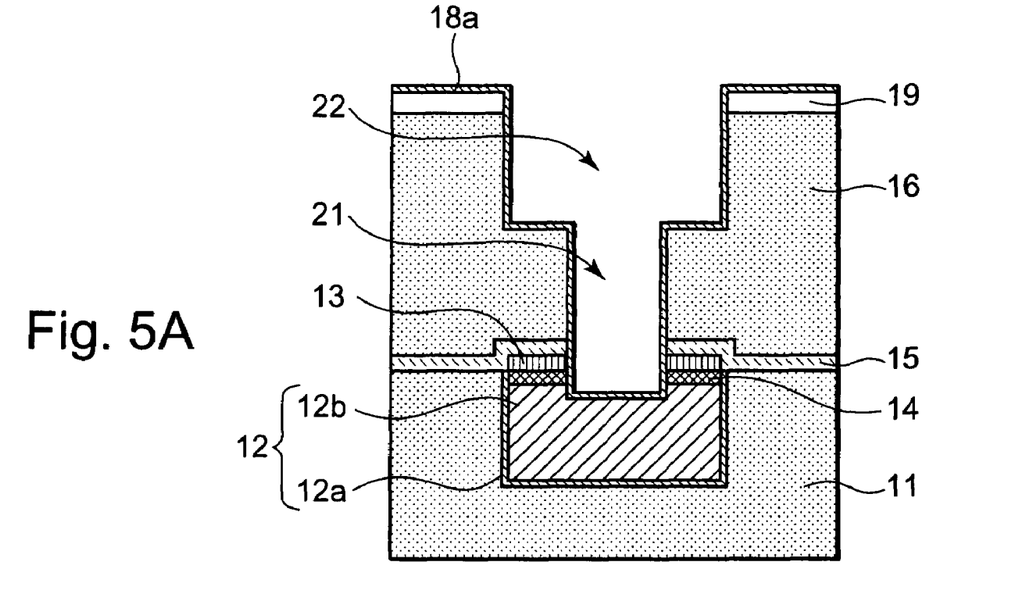
FIGS. 5A and 5B are cross-sectional views of steps for illustrating a method of manufacturing the semiconductor device of the first embodiment thereof.
Figure 5B:
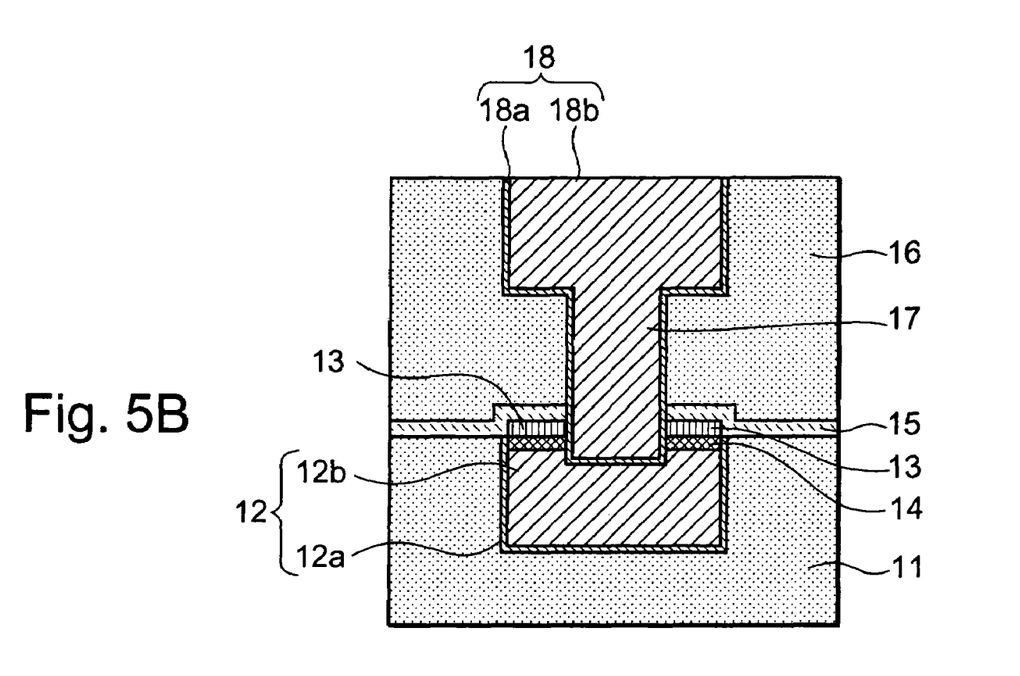

Subsequently, as shown in FIG. 5A, the third barrier metal film 18a formed from a Ta/TaN laminated film and a seed Cu film (not shown) are formed by sputtering. Here, the second barrier metal also partly remains under the third barrier metal film 18a. Subsequently, a second Cu film 18b is formed with an electrolytic plating method. Thereafter, with a CMP method, part of the second barrier metal film 18a and the second Cu film 18b extending off the upper wiring groove is removed, so that an upper wiring 18 is formed. The hard mask film 19 is removed when the CMP is performed. The upper wiring 18 is electrically connected to the lower wiring 12 through the via 17 formed along with the upper wiring 18.

The above-described manufacturing processes are used and performed in a repetitive manner as needed, whereby a semiconductor device having a desired wiring layer can be acquired.

An aspect of the method for manufacturing the semiconductor device of the embodiment according to the present invention is to remove the reaction layer 14 formed between the conductive barrier film 13 at the bottom of the via hole 21, and the lower wiring 12, when the via hole 21, reaching the lower wiring 12, is formed. In this manner, by removing the reaction layer 14, a high resistance layer is serially inserted between the via 17 and the lower wiring 12, so that the via resistance can be effectively prevented from increasing. Thus, the semiconductor device, having the via resistance sufficiently lower than that of the conventional technology, can be acquired.

In the present embodiment, although a via-first dual damascene method is used, the present invention is not necessarily limited to this method and may, alternatively, use a hard mask process and a trench first process. In addition, a single damascene method may also be used.

Further, in the present embodiment, although CoWP layer is used for the conductive barrier film 13, CoWB or material including Cobalt may also be used.

Further, in the present embodiment, although Cu is used as a wiring (the lower wiring 12, the upper wiring 18) material, the present embodiment is not necessarily limited to this material and may, alternatively, use anyone of copper, aluminum, silver, and an alloy composed of these materials.

Still further, in the present embodiment, although the Ta/TaN laminated film is used as the barrier metal film (the first barrier metal 12a, the second barrier metal 20a, the third barrier metal 18a), an embodiment of the present invention is not necessarily limited to the above-described film and may, alternatively, use a Ta film, a TaN film, a WN film, a Ti film, a TiN film, a Ru film, a RuN film or a laminated film formed from these films.

Further, for the first interlayer insulation film 11 and the second interlayer insulation film 16, a low dielectric constant film with a dielectric constant of 2.5 or less can be used to reduce a parasitic capacity between wirings.

Further, with respect to the first interlayer insulation film 11 and the second interlayer insulation film 16, an interlayer insulation film having a porous structure can also be used. Here, the interlayer insulation film having a porous structure designates one having, in a molecular structure, a larger number of small holes than SiO2.

Still further, in the present embodiment, although the SiCN film is used as the diffusion barrier film 15, an embodiment of the present invention is not necessarily limited to the above film and may, alternatively, use an SiC film, an SiOC film, an SiN film or a laminated film formed from these films. In addition, it is also possible to omit the formation of the diffusion barrier film 15.

Yet further, in the present embodiment, although the SiO2 film is used as the hardmask film 19, an embodiment of the present invention is not necessarily limited to this film and may, alternatively, use an SiO2 film, an SiOC film, an SiCN film, an SiC film, an SiN film, an SiON film or a laminated film formed from these films.

A semiconductor device of a comparative example is described with reference to FIGS. 6 and 7.

A sectional structure of a connection portion of the lower wiring 12 and the via 17 is described with reference to FIGS. 6A to 6C. FIG. 6A shows the case (herein after referred to as comparative example 1) where a CoWP layer 13 and a reaction layer 14 exist at an interface where a lower surface of a via 17 and a lower wiring 12 are joined, and FIG. 6B shows the case (herein after referred to as comparative example 2) where only the reaction layer exists at the interface. FIG. 6C is concerned with the above-described embodiment, in which the CoWP layer and the reaction layer 14 has been removed when a via hole is formed, so that neither CoWP nor reaction layer exists at the interface (herein after referred to as present embodiment). Respective structures are the same except for the joint portion of the lower surface of the via 17 and the lower wiring 12.

Figure 6A:
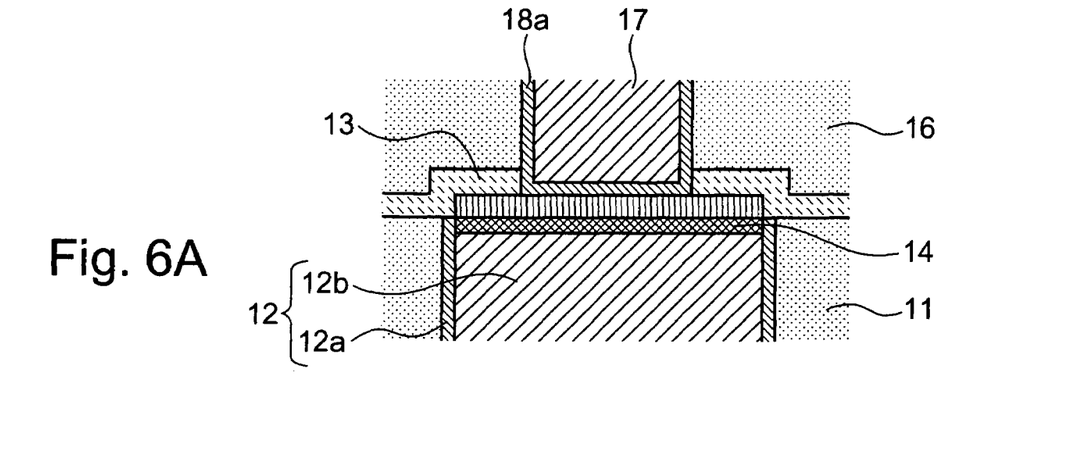
FIGS. 6A to 6C are cross-sectional views showing semiconductor devices of the first embodiment thereof and comparative examples.
Figure 6B:
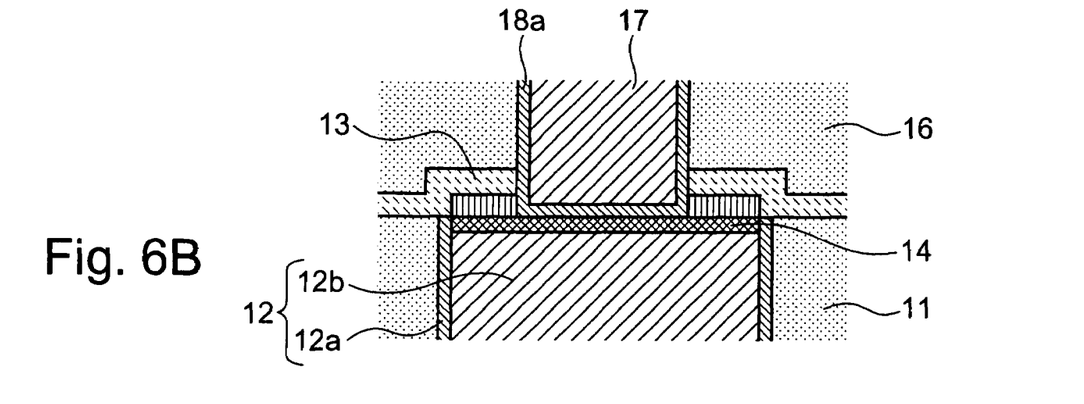
Figure 6C:
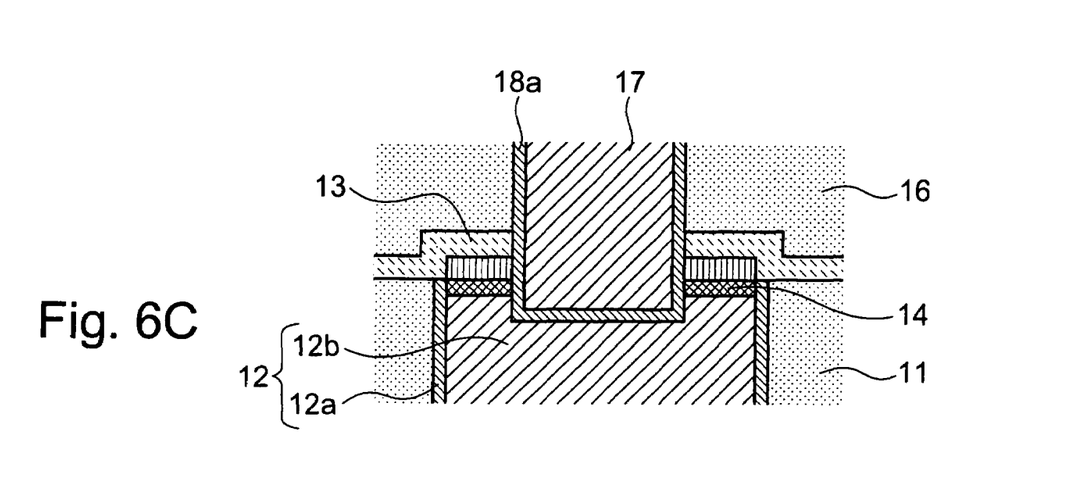
Figure 7:
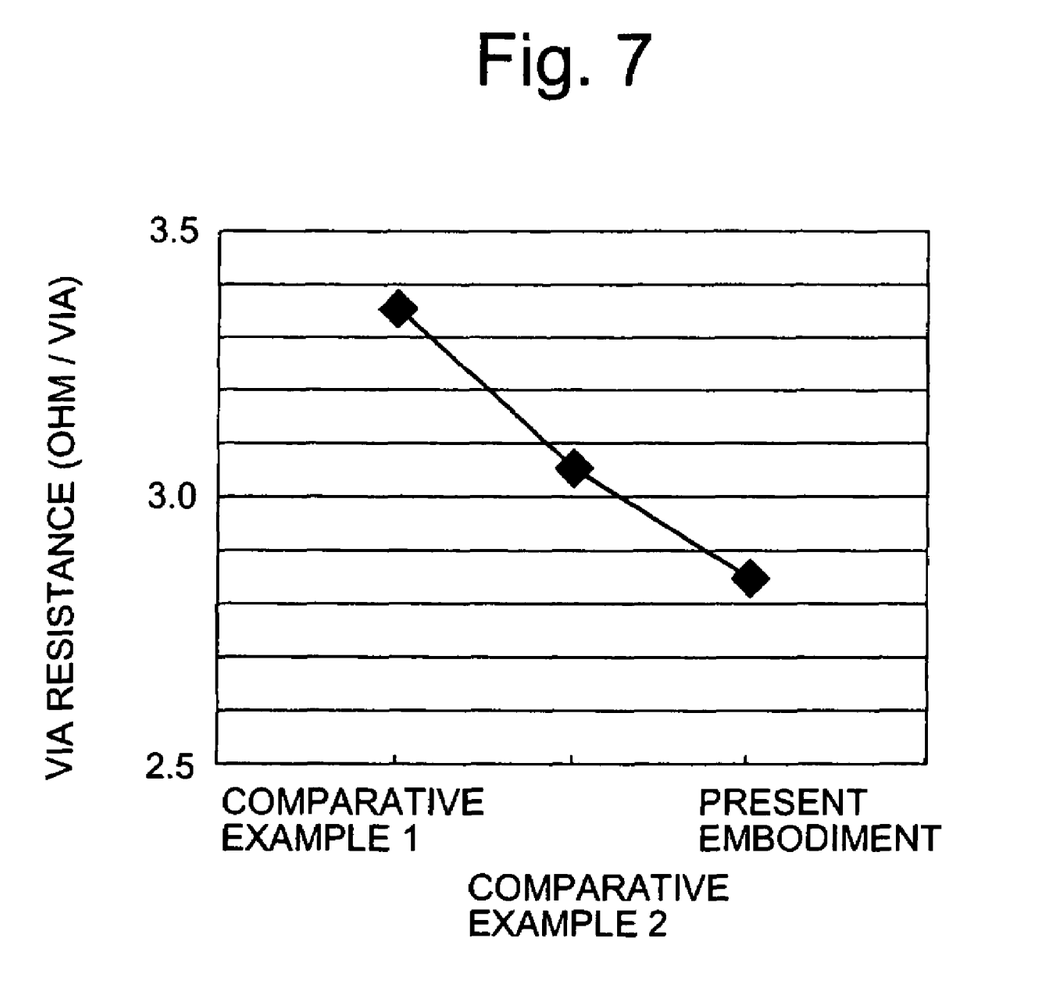
FIG. 7 is a graph showing electric characteristics of the first embodiment thereof and comparative examples.

FIG. 7 shows a comparison result of via resistances of the respective structures shown in FIGS. 6A to 6C. A via resistance is acquired by using a known via chain measurement pattern. A predetermined voltage is applied in between upper and lower wirings.

With reference to FIG. 7, the via resistances of the respective structures are compared. It can be seen that the via resistances are decreased in the order of the comparative example 1, the comparative example 2 and the present embodiment.

The via resistance of the present embodiment becomes clearly smaller than those of the comparative examples.

As described above, it has been confirmed that the via resistance of the present embodiment becomes lower to those of the comparative examples. This is because, in the case of the comparative examples 1 and 2, the CoWP layer or the reaction layer exists at the interface where the lower surface of the via and the lower wiring are joined, and, on the other hand, in the case of the present embodiment, a layer which results in a factor causing an increase of the via resistance does not exist. As described in the manufacturing method in the present invention, the CoWP layer at the bottom of the via hole and the reaction layer are removed when the via hole is formed, so that the via resistance is prevented from increasing.

As described above, with FIGS. 6 and 7, according to the present embodiment, the via resistance can be sufficiently reduced, as compared with those of the comparative examples.

Figure 8A:
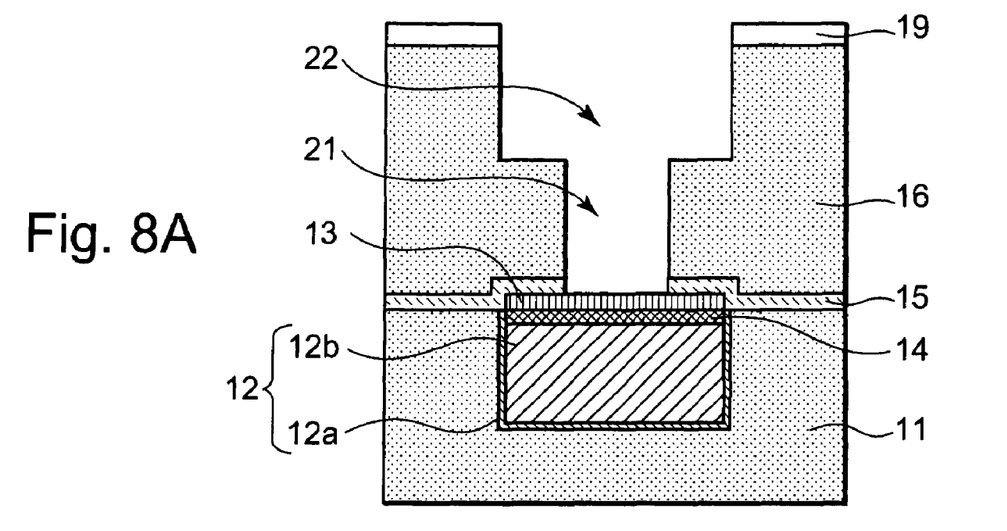
FIGS. 8A and 8B are cross-sectional views showing steps for illustrating a method of manufacturing a semiconductor device of a second embodiment of the present invention.

A method of manufacturing a semiconductor device of a second embodiment of the present invention is described below with reference to FIGS. 8 and 9.

As described in the first embodiment, a lower wiring 12 is formed on a first interlayer insulation film 11, and a conductive barrier film 13 formed of CoWP, a diffusion barrier film 15 and a second interlayer insulation film 16 are sequentially laminated on the lower wiring 12. In this case too, a reaction layer 14 is, formed between the lower wiring 12 and the conductive barrier film 13. Next, as in the case of the first embodiment, as shown in FIG. 8A, a via hole 21, reaching the conductive barrier film 13, and a upper wiring groove 22, are formed.

Figure 8B:
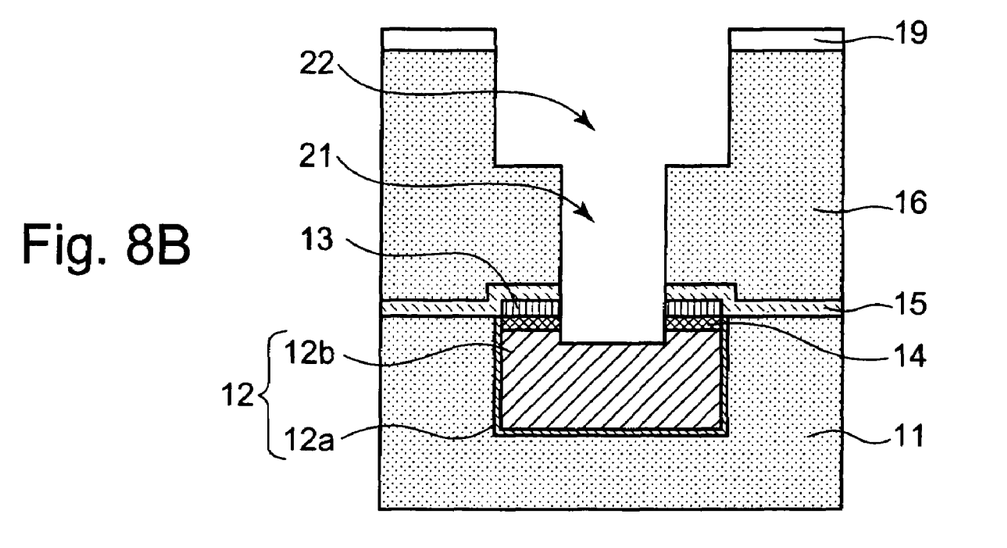

Next, as shown in FIG. 8B, the conductive barrier film 13 and the reaction film 14 are sequentially removed by dry etching by using, for example, a chlorine-based gas.

Figure 9A:
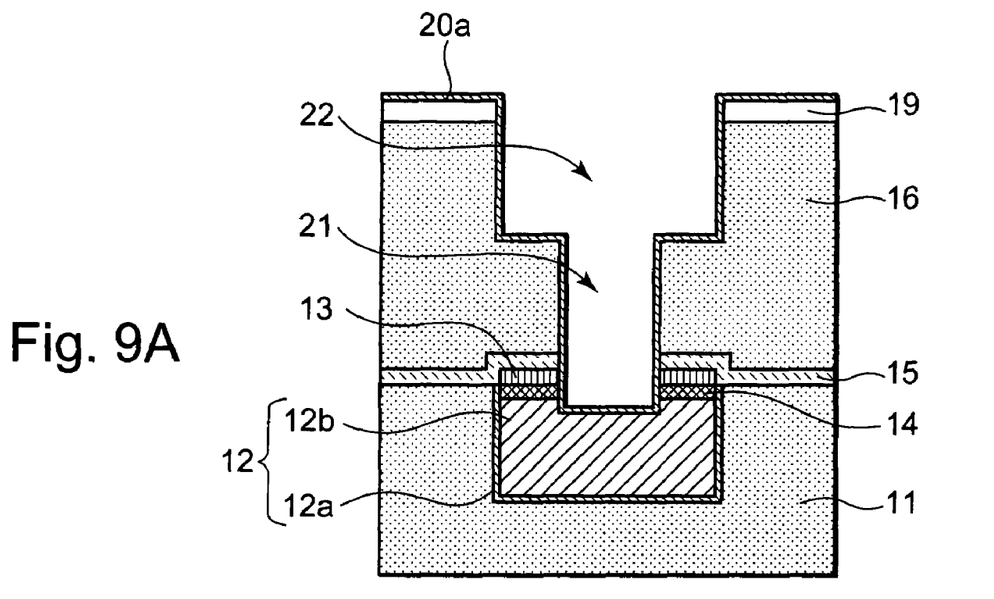
FIGS. 9A and 9B are cross-sectional views of steps for illustrating a method of manufacturing the semiconductor device of the second embodiment thereof.
Figure 9B:
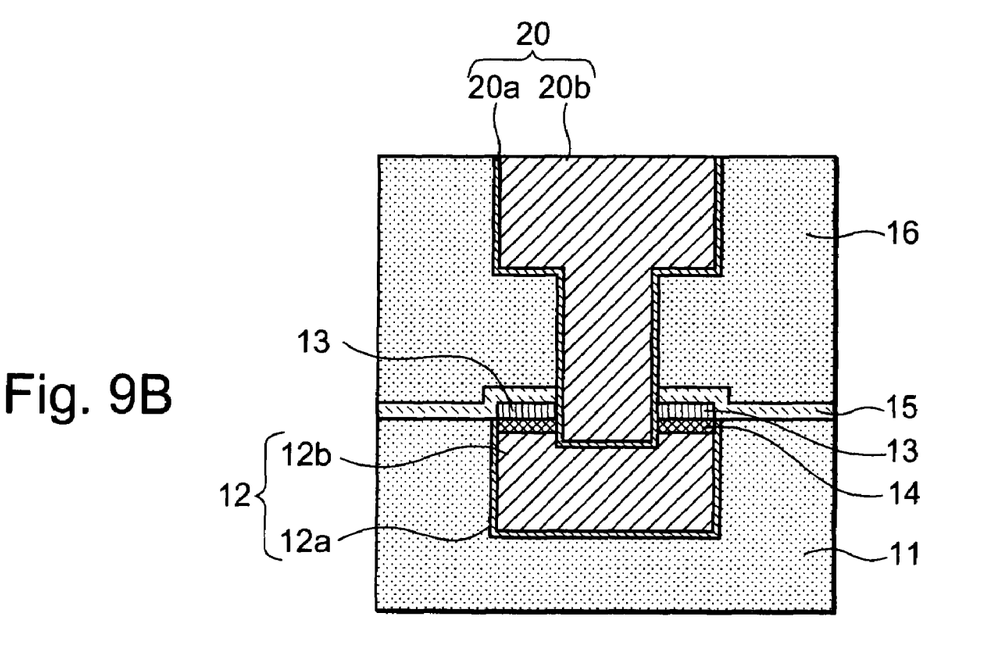

Next, as shown in FIG. 9A, the second barrier metal film, for example, formed of Ta/TaN, and the second seed Cu film (not shown) are formed on all surfaces.

Subsequently, a second Cu film 20b is formed by electroplating, so that the via hole 21 and the upper wiring groove 22 are filled with the second Cu film 20b. As shown in FIG. 9B, by using a CMP method, part of a second barrier metal film 20a and the second Cu film 20b extending off the upper wiring groove 22 is removed, so that an upper wiring 20 is formed. The hard mask film 19 is removed when the CMP is performed.

The above-described manufacturing processes are used and performed in a repetitive manner as needed, whereby a semiconductor device having a desired wiring layer can be acquired.

In the present embodiment, in a process in which the via hole 21 is formed, the reaction layer is removed along with the conductive barrier film 13 at the bottom of the via hole 21. Thus, since neither the conductive barrier film 13 nor the reaction layer 14 exists at an interface where the lower surface of the via 17 and the lower wiring 12 are joined, a semiconductor device having a sufficiently low via resistance can be provided.

What is claimed is:

1. A method of manufacturing a semiconductor device having a multilayer interconnection formed in a damascene structure, comprising:
    forming a lower wiring in a first interlayer insulation film;
    forming a conductive barrier film on the lower wiring;
    forming a second interlayer insulation film covering the first interlayer insulation film and the conductive barrier film;
    forming a via hole, which reaches the lower wiring, in the second interlayer insulation film and the conductive barrier film,
    wherein the forming the via hole includes removing a reaction layer formed between the conductive barrier film and the lower wiring;
    forming a barrier metal film on an entire surface, during a period between the formation of the via hole in the second interlayer insulation film and the formation of the via hole in the conductive barrier film, so that the barrier metal film should cover the via hole in the second interlayer insulation film; and
    removing a barrier metal film from a bottom of the via hole during the period.

2. The method of manufacturing the semiconductor device according to claim 1, wherein the lower surface of the via hole is lower than the upper surface of the lower wiring.

3. The method of manufacturing the semiconductor device according to claim 1, wherein the lower wiring contains any of copper, aluminum, silver, and an alloy composed of these metals.

4. The method of manufacturing the semiconductor device according to claim 1, wherein the conductive barrier film comprises material including Cobalt.

5. The method of manufacturing the semiconductor device according to claim 1, wherein the conductive barrier film comprises any of CoWP and CoWB.

6. The method of manufacturing the semiconductor device according to claim 1, wherein at least one of the first interlayer insulation film and the second interlayer insulation film is comprises a low dielectric constant film with a dielectric constant of 2.5 or less.

7. The method of manufacturing the semiconductor device according to claim 1, wherein at least one of the first interlayer insulation film and the second interlayer insulation film comprises a low dielectric constant film having a porous structure.

8. The method of manufacturing the semiconductor device according to claim 1, wherein the barrier metal film comprises any one of a Ta film, a TaN film, a WN film, a Ti film, a TiN film, a Ru film, a RuN film, and a laminated film formed of these films.

9. A method of manufacturing a semiconductor device, comprising:
    forming a first wiring layer;
    covering the first wiring layer with a conductive barrier film;
    forming an interlayer insulating film on the conductive barrier film, a reaction layer being formed between the first wiring layer and the conductive barrier film;
    removing respective portions of interlayer insulating film, the reaction layer and the conductive barrier film to form a via hole that exposes a portion of the first wiring layer;
    forming a barrier metal film on an entire surface, during a period between the formation of the via hole in the interlayer insulation film and the formation of the via hole in the conductive barrier film, so that the barrier metal film should cover the via hole in the interlayer insulation film; and
    removing a barrier metal film from a bottom of the via hole during the period.

10. The method of manufacturing the semiconductor device according to claim 9, wherein the lower surface of the via hole is lower than the upper surface of the first wiring layer.

11. The method of manufacturing the semiconductor device according to claim 9, wherein the conductive barrier film comprises material including Cobalt.

12. The method of manufacturing the semiconductor device according to claim 9, wherein the conductive barrier film comprises any of CoWP and CoWB.

13. The method of manufacturing the semiconductor device according to claim 9, wherein the first wiring layer contains any of copper, aluminum, silver, and an alloy composed of these metals.

14. The method of manufacturing the semiconductor device according to claim 9, wherein the interlayer insulation film comprises a low dielectric constant film with a dielectric constant of 2.5 or less.

15. The method of manufacturing the semiconductor device according to claim 9, wherein the interlayer insulation film comprises a low dielectric constant film having a porous structure.

16. The method of manufacturing the semiconductor device according to claim 9, wherein the barrier metal film comprises any one of a Ta film, a TaN film, a WN film, a Ti film, a TiN film, a Ru film, a RuN film, and a laminated film formed of these films.

* * * * *